(12) United States Patent
Park

(10) Patent No.: US 8,298,961 B2
(45) Date of Patent: Oct. 30, 2012

(54) PATTERNS OF SEMICONDUCTOR DEVICE AND METHOD OF FORMING THE SAME

(75) Inventor: Sung Kee Park, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 166 days.

(21) Appl. No.: 12/650,498

(22) Filed: Dec. 30, 2009

(65) Prior Publication Data

US 2010/0207248 A1   Aug. 19, 2010

(30) Foreign Application Priority Data

Feb. 13, 2009 (KR) .................. 10-2009-0011756

(51) Int. Cl.
*H01L 21/475* (2006.01)

(52) U.S. Cl. ........ 438/736; 438/700; 438/701; 438/734; 438/737; 438/738; 257/E21.017; 257/E21.214; 257/E21.249

(58) Field of Classification Search ........... 257/E21.017, 257/E21.02, E21.214, E21.249, E21.305; 438/694, 696, 699, 700, 701, 702, 703, 717, 438/734, 736, 737, 738, 740, 743, 744
See application file for complete search history.

(56) References Cited

U.S. PATENT DOCUMENTS

| | | | | |
|---|---|---|---|---|
| 6,875,703 B1 * | 4/2005 | Furukawa et al. | ............ | 438/736 |
| 7,348,636 B2 * | 3/2008 | Ryu et al. | ................ | 257/369 |
| 7,390,750 B1 * | 6/2008 | Ramkumar et al. | ......... | 438/706 |
| 8,048,812 B2 * | 11/2011 | Tran et al. | ................ | 438/717 |
| 8,057,692 B2 * | 11/2011 | Park et al. | ................ | 216/46 |
| 2006/0068596 A1 * | 3/2006 | Dobuzinsky et al. | ........ | 438/740 |
| 2007/0249174 A1 * | 10/2007 | Yang | ........................ | 438/712 |

FOREIGN PATENT DOCUMENTS

KR    10-2005-0007779    1/2005
KR    10-2006-0110706    10/2006

* cited by examiner

*Primary Examiner* — Eduardo A Rodela
(74) *Attorney, Agent, or Firm* — Marshall, Gerstein & Borun LLP

(57) ABSTRACT

A method of forming patterns of a semiconductor device comprises providing a semiconductor substrate comprising a first region wherein first patterns are to be formed and a second region wherein second patterns are to be formed, each of the second patterns having a wider width than the first patterns, forming an etch target layer over the semiconductor substrate, forming first etch patterns over the etch target layer of the first and second regions, forming second etch patterns on both sidewalls of each of the first etch patterns, wherein the second etch pattern formed in the second region has a wider width than the second etch pattern formed in the first region, removing the first etch patterns, forming third etch patterns over the etch target layer of the second region, the third etch pattern overlapping part of the second pattern, and etching the etch target layer using the third etch patterns and the second etch patterns as an etch mask, to form the first and second patterns.

15 Claims, 5 Drawing Sheets

PATTERNS OF SEMICONDUCTOR DEVICE AND METHOD OF FORMING THE SAME

CROSS-REFERENCE TO RELATED APPLICATION

Priority to Korean patent application number 10-2009-0011756 filed on Feb. 13, 2009, the entire disclosure of which is incorporated by reference herein, is claimed.

BACKGROUND

An embodiment relates generally to patterns of a semiconductor device and a method of forming the same and, more particularly, to patterns of a semiconductor device for forming fine patterns and a method of forming the same.

In the manufacture of semiconductor devices, a number of elements, such as gates and isolation layers, are formed in a semiconductor substrate. To electrically couple the gates together, metal wirings are formed. Junctions (e.g., the sources or the drains of transistors) of the metal wirings and the semiconductor substrate are electrically coupled together by contact plugs.

The gates, the metal wirings, etc. are for the most part formed through a pattern formation process. Thus, an etch target layer (e.g., a gate stack layer, a conductive layer, or an insulating layer) to be patterned is formed over a semiconductor substrate, etch mask patterns are formed over the etch target layer, and the etch target layer is then patterned through an etch process using the etch mask patterns. To form fine patterns through such a pattern formation process it is necessary to form ultra-small and high-performance semiconductor devices.

However, the size of patterns that can be formed is restricted by limitations of equipment used for a pattern formation process, and many difficulties are encountered in overcoming such equipment limitations. Furthermore, in a case in which first patterns and second patterns with different widths are formed on the same plane, mask processes for forming the first patterns and the second patterns must be individually performed. Accordingly, the interval between the first patterns and the second patterns can become irregular or the width of a pattern formed between the first patterns and the second patterns can become irregular due to the overlay margin of a mask for forming the patterns.

BRIEF SUMMARY

According to an embodiment of the present disclosure, when first patterns and second patterns, each of the second patterns having a wider width than the first patterns, are formed on the same plane, some of etch patterns for forming the first patterns are formed at the boundaries of the first patterns and the second patterns. Accordingly, the interval between the second patterns and the first patterns neighboring the second pattern can become regular. Furthermore, some of the etch patterns for forming the first patterns are also formed in part of a region in which the second patterns are formed. Accordingly, the margin of the etch patterns for forming the second patterns can be increased, and so the widths of the second patterns can become regular.

A method of forming patterns of a semiconductor device according to an aspect of the present disclosure comprises providing a semiconductor substrate, comprising a first region in which first patterns are to be formed and a second region in which second patterns each having a wider width than the first patterns are to be formed, forming an etch target layer over the semiconductor substrate, forming first etch patterns each having two sidewalls over the etch target layer of the first and second regions, forming second etch patterns on both sidewalls of each of the first etch patterns, wherein each of the second etch patterns formed in the second region has a wider width than each of the second etch patterns formed in the first region, removing the first etch patterns, forming third etch patterns over the etch target layer of the second region, the third etch pattern overlapping a portion of the second region where the second patterns are to be formed, and etching the etch target layer using the third etch patterns and the second etch patterns as an etch mask to form the first patterns and the second patterns.

The width of each of the second etch patterns formed in the second region preferably is identical with an interval between the first etch pattern, formed at a boundary of the first region and the second region, and the first etch pattern formed in the second region. The width of each of the first etch patterns formed at a boundary of the first region and the second region preferably is 1 to 4 times greater than a width of each of the first etch patterns formed in the first region. The width of each of the second etch patterns formed in the second region preferably is 1 to 1.9 times greater than a width of each of the second etch patterns formed in the first region. The etch target layer preferably comprises a hard mask layer. The etch target layer preferably comprises a gate stack layer. The first etch patterns preferably have a different etch selectivity from the second etch patterns or the etch target layer. The first etch patterns preferably comprise an oxide layer or a carbon layer. The second etch patterns preferably comprise a polysilicon layer or a nitride layer. The third etch patterns preferably comprise a polysilicon layer or a nitride layer. The interval between the second patterns and the first patterns neighboring the second patterns preferably is defined by a width of the first etch pattern formed at a boundary of the first and second regions.

A method of forming patterns of a semiconductor device according to another aspect of the present disclosure comprises providing a semiconductor substrate, comprising a first region in which word lines are to be formed and a second region in which selection lines each having a wider width than the word line are to be formed, forming a gate stack layer over the semiconductor substrate, forming first etch patterns each having two sidewalls over the gate stack layer of the first and second regions, forming second etch patterns on both sidewalls of each of the first etch patterns, wherein each of the second etch patterns formed in the second region has a wider width than each of the second etch patterns formed in the first region, removing the first etch patterns, forming third etch patterns over the gate stack layer of the second region, the third etch patterns overlapping a portion of the second region where the selection lines are to be formed, and etching the gate stack layer using the third etch patterns and the second etch patterns as an etch mask to form the word lines and the selection lines.

The patterns of a semiconductor device according to yet another aspect of the present disclosure comprise a semiconductor substrate that comprises a first region in which first patterns are to be formed and a second region in which second patterns each having a wider width than the first patterns are to be formed, an etch target layer formed over the semiconductor substrate, second etch patterns formed over the etch target layer, in the first region to form the first patterns, at a boundary of the first and second regions to define an interval between the second pattern and the first pattern neighboring the second pattern, and in the second region to provide a margin of etch patterns for forming the second patterns, and third etch patterns formed over the etch target layer of the second region and overlapping the first patterns formed in the second region to form the second patterns.

DESCRIPTION OF EMBODIMENT

Figure 1A:
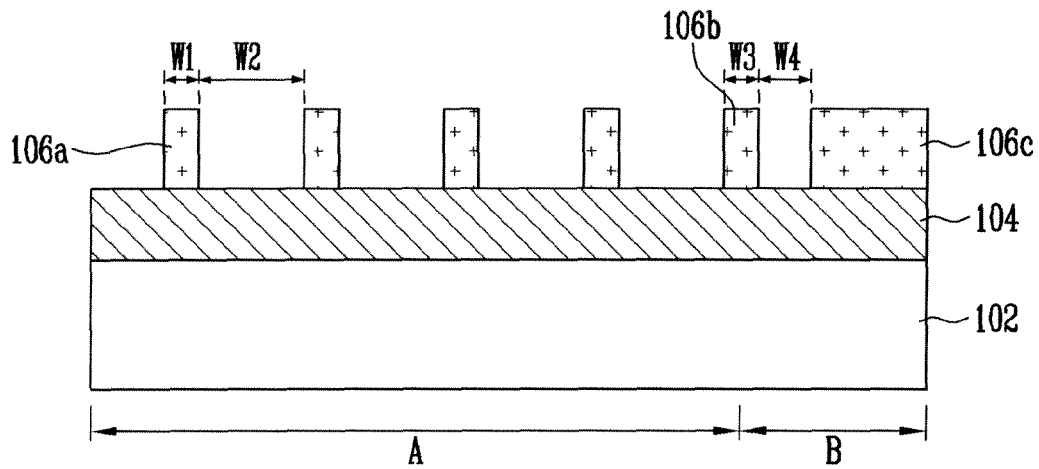
FIGS. 1A to 1F are cross-sectional views illustrating the patterns of a semiconductor device and a method of forming the same according to an embodiment of the present disclosure.

An embodiment of the present disclosure is described in detail below with reference to the accompanying drawings. The drawing figures are provided to allow those having ordinary skill in the art to understand the scope of the embodiment of the disclosure.

Figure 1B:
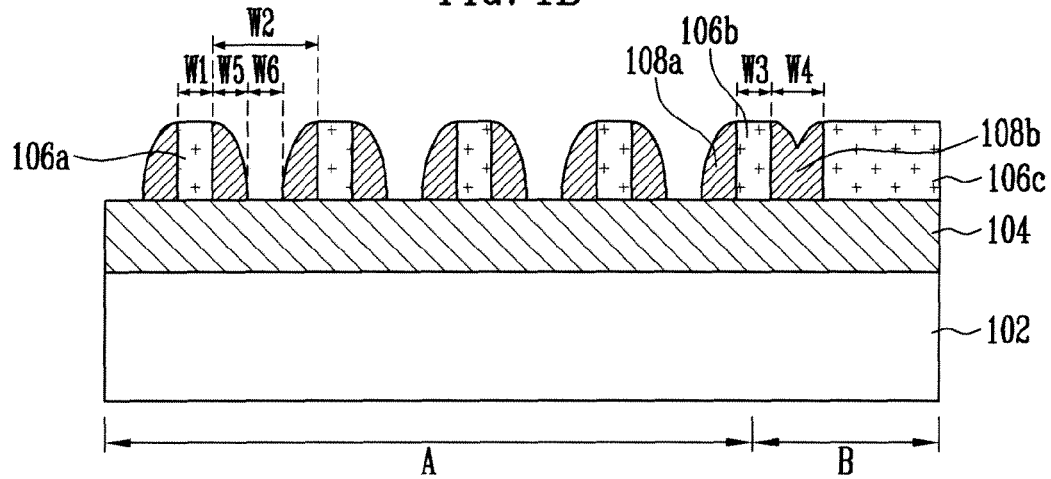
Figure 1C:
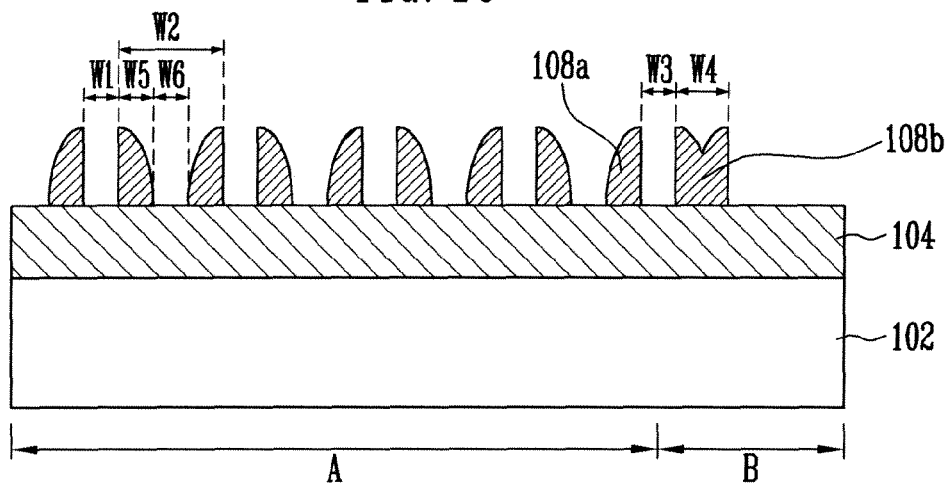
Figure 1D:
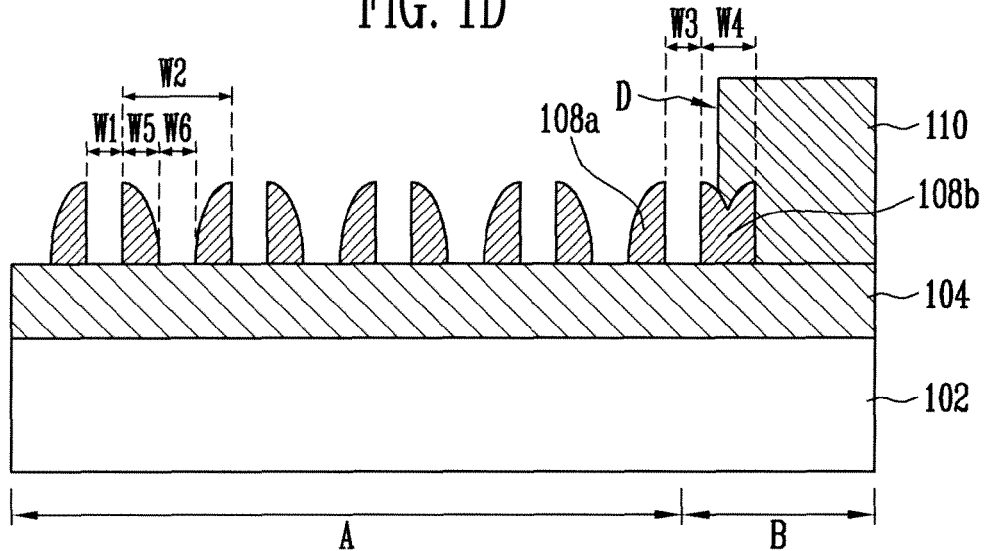
Figure 1E:
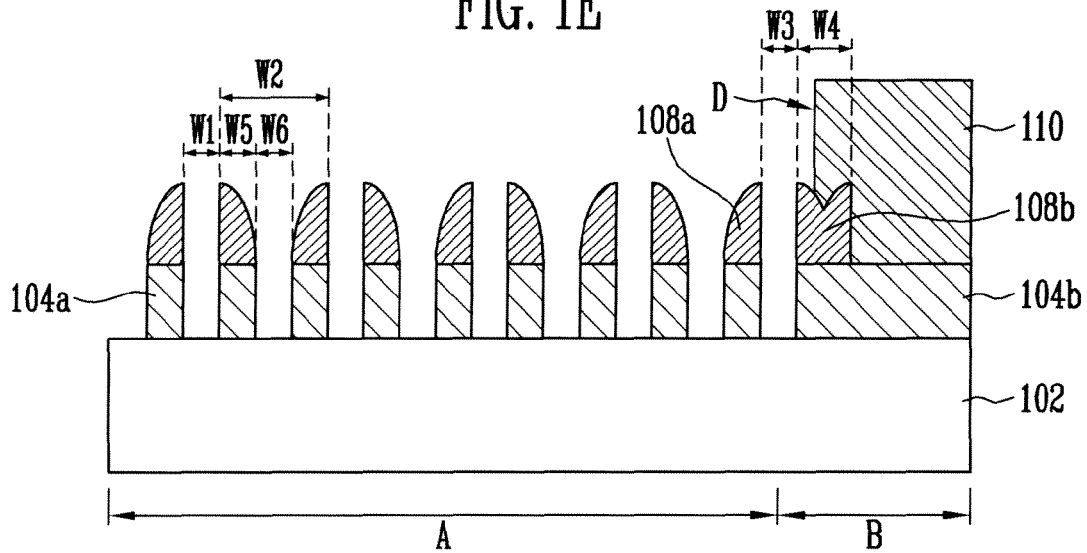
Figure 1F:
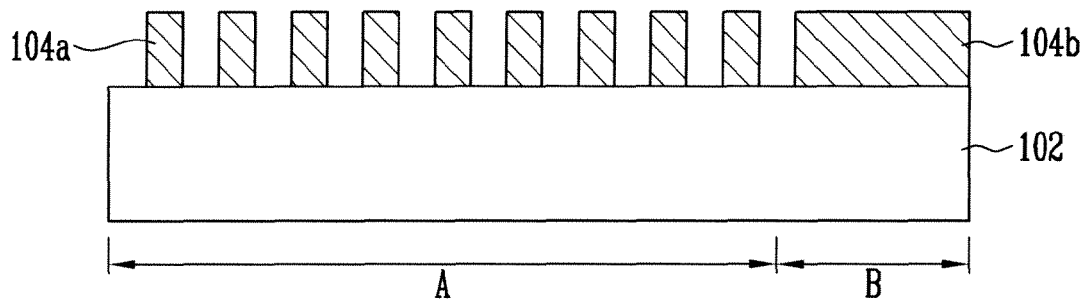
Figure 2A:
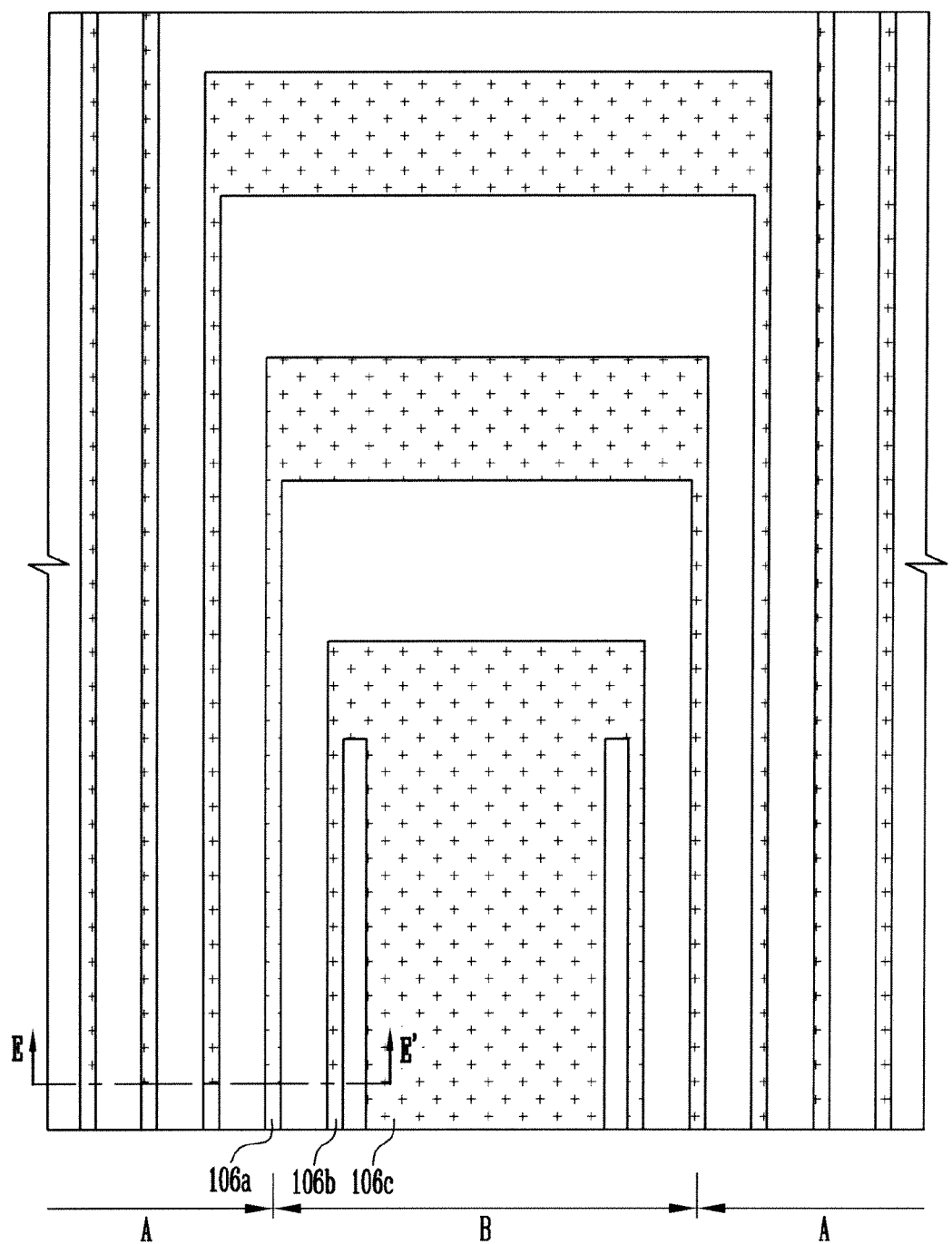
FIGS. 2A to 2C are plan views illustrating the patterns of a semiconductor device and a method of forming the same according to an embodiment of the present disclosure.
Figure 2B:
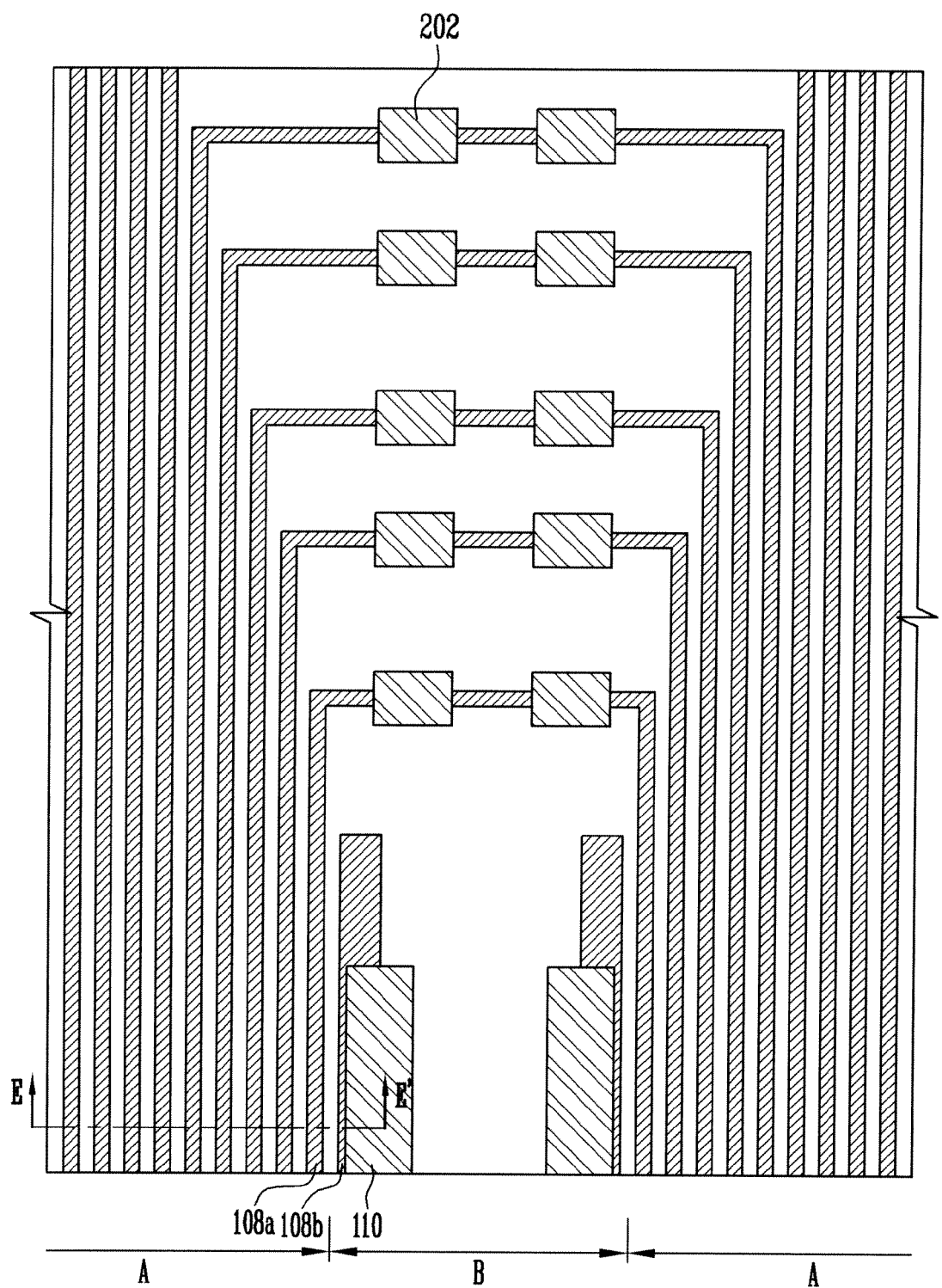
Figure 2C:
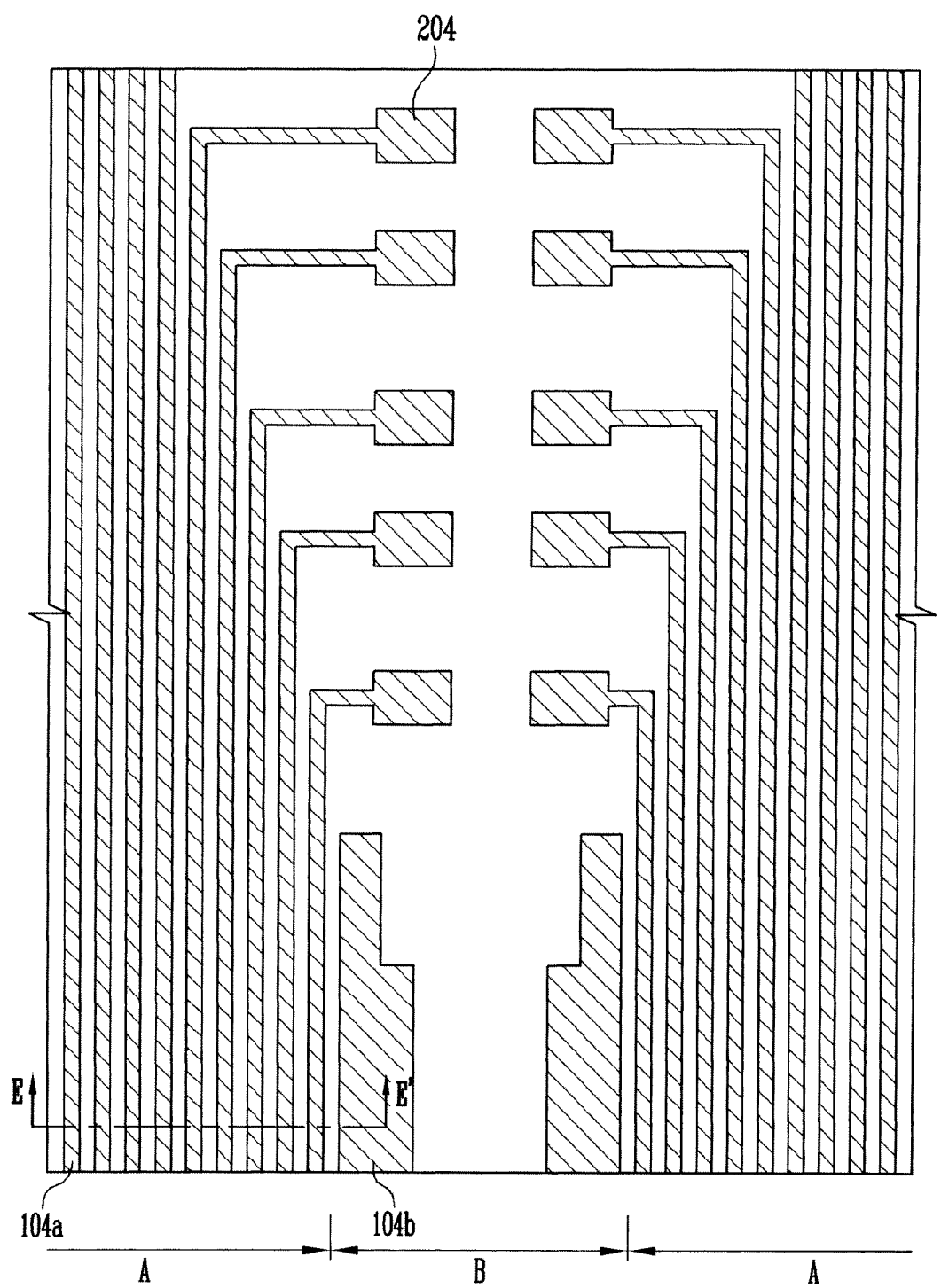

FIGS. 1A to 1F are cross-sectional views illustrating the patterns of a semiconductor device and a method of forming the same according to an embodiment of the present disclosure, and FIGS. 2A to 2C are plan views illustrating the patterns of a semiconductor device and the method of forming the same according to an embodiment of the present disclosure. In particular, FIG. 1A is a cross-sectional view of the device taken along line E-E' of FIG. 2A, FIG. 1D is a cross-sectional view of the device taken along line E-E' of FIG. 2B, and FIG. 1F is a cross-sectional view of the device taken along line E-E' of FIG. 2C.

Referring to FIGS. 1A and 2A, there is provided a semiconductor substrate 102, including a first region A in which first patterns are formed and a second region B in which second patterns, each having a wider width than the first patterns, are formed. In the case of, for example, a flash memory device, the first region A can be a region in which word lines are formed, and the second region B can be a region in which select lines, such as drain select lines or source select lines, are formed. An etch target layer 104 is formed over the semiconductor substrate 102. The etch target layer 104 is formed into the first patterns in the first region A and into the second patterns in the second region B through a subsequent etch process. In the case of, for example, a flash memory device, the etch target layer 104 typically is a hard mask layer, or a gate stack layer including a tunnel insulating layer, a floating gate, a dielectric layer, and a control gate.

First etch patterns 106a, 106b, and 106c are formed over the etch target layer 104. The first etch patterns 106a, 106b, and 106c, each having two sidewalls, are primarily auxiliary patterns for forming patterns to define the first patterns formed in the first region A. The first etch patterns 106a, 106b, and 106c can restrict the interval between the first patterns and the second patterns or to increase the margin the second patterns. The first etch patterns 106a, 106b, and 106c preferably comprise material (e.g., oxide or carbon) having an etch selectivity that is different from the etch selectivity of the underlying etch target layer 104 or second etch patterns formed in a subsequent process.

An interval W2 between the first etch patterns 106a formed in the first region A preferably is 3 times greater than the width W1 of each of the first etch patterns 106a formed in the first region A. Furthermore, a width W3 of the first etch pattern 106b formed at the boundary of the first region A and the second region B restricts the interval between a second pattern and a first pattern neighboring the second pattern. The width W3 of the first etch pattern 106b preferably is 1 to 4 times greater than the width W1 of each of the first etch patterns 106a formed in the first region A. An interval W4 between the first etch pattern 106b formed in the first region A and the first etch pattern 106c formed in the second region B is set such that the space between the first etch pattern 106b and the first etch pattern 106c is filled with the second etch pattern in a subsequent process of forming the second etch patterns. The interval W4 preferably is, for example, 1 to 1.9 times as great as the width W1 of each of the first etch patterns 106a formed in the first region A.

Referring to FIG. 1B, a material layer for the second etch patterns is formed over the etch target layer 104, including the first etch patterns 106a, 106b, and 106c. An anisotropic etch process is performed to form the second etch patterns 108a and 108b on both sidewalls of each of the first etch patterns 106a, 106b, and 106c. The second etch patterns 108a and 108b preferably comprise a material (e.g., polysilicon or nitride) having an etch selectivity that is different from the etch selectivity of the etch target layer 104 or the first etch patterns 106a, 106b, and 106c. The width W5 of each of the second etch patterns 108a formed in the first region A preferably is identical with the width W1 of the first etch pattern 106a formed in the first region A, and an interval W6 between the second etch patterns 108a preferably is identical with the width W5 of the second etch pattern 108a. Furthermore, the second etch pattern 108b preferably is filled between the first etch pattern 106b, formed at the boundary of the first region A and the second region B, and the first etch pattern 106c, formed in the second region B. Here, the width W4 of the second etch pattern 108b formed in the second region B preferably is 1 to 1.9 times as great as the width W5 of the second etch pattern 108a formed in the first region A.

Referring to FIG. 1C, the first etch patterns 106a, 106b, and 106c are removed. Accordingly, the second etch patterns 108a and 108b remain over the etch target layer 104.

Referring to FIGS. 1D and 2B, third etch patterns 110 are formed over the etch target layer 104 of the second region B, including the second etch patterns 108b formed in the second region B. The third etch patterns 110 restrict the second patterns formed in the second region B. The third etch patterns 110 preferably comprise material (e.g., polysilicon or nitride) having an etch selectivity that is different from the etch selectivity of the etch target layer 104 or the second etch patterns 108a and 108b. Thus, in the case in which the second etch patterns 108a and 108b comprise polysilicon, the third etch patterns 110 preferably comprise nitride. In the case in which the second etch patterns 108a and 108b comprise nitride, the third etch patterns 110 preferably comprise polysilicon.

In a subsequent etch process, the etch target layer 104 is etched using all the second etch patterns 108a and 108b and the third etch patterns 110 as an etch mask. Accordingly, a side face D of the third etch pattern 110 close to the first region A preferably has a margin as much as the width W4 of the second etch pattern 108b formed in the second region B. Consequently, when the third etch patterns 110 are formed, the side face D of the third etch pattern 110 preferably has a margin as much as the width W4.

Meanwhile, pad patterns 202 for defining pad regions preferably are formed in the pad regions in which contact plugs are formed at the same time when the first etch patterns 110 are formed.

Referring to FIG. 1E, the etch target layer 104 is etched through an etch process using the second etch patterns 108a and 108b and the third etch patterns 110 as an etch mask. Accordingly, the first patterns 104a are formed in the first region A, and the second patterns 104b each having a wider width than the first pattern 104a are formed in the second region B. Here, in the above process, the width W3 of the first etch pattern 106b (refer to FIG. 1B) formed at the boundary of the first region A and the second region B defines the interval between the second pattern 104b and the first pattern 104a neighboring the second pattern 104b. Furthermore, the width of the second pattern 104b is defined by a width in which the second etch pattern 108b and the third etch pattern 110 formed in the second region B overlap each other.

Referring to FIGS. 1F and 2C, the second etch patterns 108a and 108b and the third etch patterns 110 are removed to complete the patterns of the semiconductor device according to the present disclosure. Here, the pad patterns 202 formed in the above process are removed to expose pad regions 204. An etch process of insulating neighboring pads from each other by cutting patterns between the pad regions 204 can be further added.

In accordance with the patterns of the semiconductor device and the method of forming the same according to the present disclosure, when the first patterns 104a and the second patterns 104b having different widths are formed, the interval between the second pattern 104b and the first pattern 104a neighboring the second pattern 104b can be defined by the width W3 of the first etch pattern 106b (refer to FIG. 1B) formed at the boundary of the first region A and the second region B. Accordingly, the second patterns 104b, and the interval between the first pattern 104a and the second pattern 104b can become regular. Further, since the interval between the first pattern 104a and the second pattern 104b is restricted to 4 times or less the width W1 of the first etch pattern 106a (refer to FIG. 1B) formed in the first region A. Accordingly, the width of a pattern at the boundary of the first pattern 104a and the second pattern 104b can be prevented from becoming irregular due to a loading effect.

Furthermore, the width W4 of the second etch pattern 108b formed in the second region B can increase the margin of the third etch patterns 110 for forming the second patterns 104b. Accordingly, the width of the second patterns 104b can become regular.

In accordance with the patterns of the semiconductor device and the method of forming the same according to the present disclosure, although the first patterns and the second patterns each having a wider width than the first pattern are formed on the same plane, the interval between the first pattern and the second pattern can become regular, and the width of each of the second patterns can become regular. Accordingly, a semiconductor device having more reliable patterns can be manufactured.

What is claimed is:

1. A method of forming patterns of a semiconductor device, the method comprising:
    providing a semiconductor substrate that comprises a first region in which first patterns are to be formed and a second region in which second patterns are to be formed, each of the second patterns having a wider width than the first patterns;
    forming an etch target layer over the semiconductor substrate including the first and second regions;
    forming first etch patterns over the etch target layer of the first and second regions, the first etch patterns each having two sidewalls;
    forming second etch patterns on both sidewalls of each of the first etch patterns, wherein each of the second etch patterns formed in the second region has a wider width than each of the second etch patterns formed in the first region;
    removing the first etch patterns;
    forming third etch patterns over the etch target layer of the second region, wherein each of the third etch patterns has a sidewall positioned over a top surface of a second etch pattern formed in the second region; and
    etching the etch target layer using the third etch patterns and the second etch patterns as an etch mask to form the first patterns and the second patterns.

2. The method of claim 1, wherein a width of each of the second etch patterns formed in the second region is identical with an interval between the first etch patterns formed at a boundary of the first region and the second region, and the first etch patterns formed in the second region.

3. The method of claim 1, wherein a width of each of the first etch patterns formed at a boundary of the first region and the second region is 1 to 4 times as greater as a width of each of the first etch patterns formed in the first region.

4. The method of claim 1, wherein a width of each of the second etch patterns formed in the second region is 1 to 1.9 times as great as a width of each of the second etch patterns formed in the first region.

5. The method of claim 1, wherein the etch target layer comprises a hard mask layer.

6. The method of claim 1, wherein the etch target layer comprises a gate stack layer.

7. The method of claim 1, wherein the first etch patterns have a different etch selectivity from the second etch patterns or the etch target layer.

8. The method of claim 1, wherein the first etch patterns comprise an oxide layer or a carbon layer.

9. The method of claim 1, wherein the second etch patterns comprise a polysilicon layer or a nitride layer.

10. The method of claim 1, wherein the third etch patterns comprise a polysilicon layer or a nitride layer.

11. The method of claim 1, wherein an interval between the second pattern and the first pattern neighboring the second pattern is defined by a width of the first etch pattern formed at a boundary of the first and second regions.

12. The method of claim 1, wherein each of the third etch patterns have a wider width than a second etch pattern formed in the second region.

13. A method of forming patterns of a semiconductor device, the method comprising:
    providing a semiconductor substrate comprising a first region in which word lines are to be formed and a second region in which selection lines each having a wider width than the word line are to be formed;
    forming a gate stack layer over the semiconductor substrate including the first and second regions;
    forming first etch patterns each having two sidewalls over the gate stack layer of the first and second regions;
    forming second etch patterns on both sidewalls of each of the first etch patterns, wherein each of the second etch patterns formed in the second region has a wider width than each of the second etch patterns formed in the first region;
    removing the first etch patterns;
    forming third etch patterns over the gate stack layer of the second region, wherein each of the third etch patterns has a sidewall positioned over a top surface of a second etch pattern formed in the second region; and
    etching the gate stack layer using the third etch patterns and the second etch patterns as an etch mask to form the word lines and the selection lines.

14. The method of claim 13, wherein an interval between the second patterns and the first patterns neighboring the second patterns is defined by a width of the first etch patterns formed at a boundary of the first and second regions.

15. The method of claim 13, wherein each of the third etch patterns have a wider width than a second etch pattern formed in the second region.

* * * * *